US011217150B2

(12) United States Patent
Han et al.

(10) Patent No.: US 11,217,150 B2
(45) Date of Patent: Jan. 4, 2022

(54) COMPENSATED TRIPLE GATE DRIVING CIRCUIT, A METHOD, AND A DISPLAY APPARATUS

(71) Applicant: BOE Technology Group Co., Ltd., Beijing (CN)

(72) Inventors: Mingfu Han, Beijing (CN); Guangliang Shang, Beijing (CN); Xing Yao, Beijing (CN); Haoliang Zheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 323 days.

(21) Appl. No.: 16/485,994

(22) PCT Filed: Sep. 6, 2018

(86) PCT No.: PCT/CN2018/104351
§ 371 (c)(1),
(2) Date: Aug. 14, 2019

(87) PCT Pub. No.: WO2020/047797
PCT Pub. Date: Mar. 12, 2020

(65) Prior Publication Data
US 2021/0335210 A1 Oct. 28, 2021

(51) Int. Cl.
*G09G 3/36* (2006.01)
*G11C 19/28* (2006.01)
*G09G 3/32* (2016.01)

(52) U.S. Cl.
CPC ....... *G09G 3/32* (2013.01); *G09G 2300/0408* (2013.01); *G09G 2310/0267* (2013.01); *G09G 2310/066* (2013.01); *G09G 2320/0252* (2013.01); *G09G 2330/026* (2013.01); *G09G 2330/028* (2013.01)

(58) Field of Classification Search
CPC .. G09G 3/20; G09G 3/32; G09G 3/36; G09G 3/3258; G09G 3/3266; G09G 3/3291; G11C 19/00; G11C 19/18; G11C 19/28; H01L 27/12; H01L 27/32
See application file for complete search history.

(56) References Cited

U.S. PATENT DOCUMENTS

| | | | | |
|---|---|---|---|---|
| 2014/0192039 A1* | 7/2014 | Wang | G11C 19/28 345/213 |
| 2015/0235590 A1* | 8/2015 | Peng | G09G 3/3674 327/109 |

* cited by examiner

*Primary Examiner* — Chanh D Nguyen
*Assistant Examiner* — Nguyen H Truong
(74) *Attorney, Agent, or Firm* — Intellectual Valley Law, P.C.

(57) ABSTRACT

The present application discloses a gate driver on array (GOA) circuit of a display panel. The GOA circuit includes a first GOA unit comprising a unit-circuitry structure having a pull-up node commonly coupled to three output transistors to control outputting of a first set of three gate-driving signals respectively to a first set of three gate lines associated with the display panel. The GOA circuit additionally includes a second GOA unit comprising a substantially same unit-circuitry structure cascaded with the first GOA unit and configured to control outputting a second set of three gate-driving signals respectively to a second set of three gate lines associated with the display panel. Moreover, the GOA circuit includes a capacitor connected from one in the second set of three output terminals of the second GOA unit to the pull-up node of the first GOA unit.

20 Claims, 4 Drawing Sheets

COMPENSATED TRIPLE GATE DRIVING CIRCUIT, A METHOD, AND A DISPLAY APPARATUS

CROSS-REFERENCE TO RELATED APPLICATION

This application is a national stage application under 35 U.S.C. § 371 of International Application No. PCT/CN2018/104351, filed Sep. 6, 2018, the contents of which are incorporated by reference in the entirety.

TECHNICAL FIELD

The present invention relates to display technology, more particularly, to a compensated triple gate driving circuit, a method, and a display apparatus.

BACKGROUND

In modern display technology, gate driver on array (GOA) circuit has been used for generating multiple gate-driving signals for progressively scanning through multiple gate lines in a display panel. This is an effective manner to drive a thin-film transistor based array of pixels in the display panel for displaying one frame of image after another thereon. Based on this display technology, many efforts are made to improve performance of the GOA circuit including limiting numbers of transistor devices in the circuit in order to achieve a narrower frame for the display panel while still providing stable waveforms for each outputted gate-driving signals. Still, better circuit design is desired to reduce variation in output delays and discharging rates among multiple gate-driving signals for efficiently charging corresponding gate lines for improving quality of the display.

SUMMARY

In an aspect, the present disclosure provides a gate driver on array (GOA) circuit of a display panel. The GOA circuit includes a first GOA unit having a unit-circuitry structure including a pull-up node commonly coupled to three or more output transistors to control outputting of a first set of three or more gate-driving signals respectively to a first set of three or more output terminals respectively connected to a first set of three or more gate lines associated with the display panel. Additionally, the GOA circuit includes a second GOA unit comprising a substantially same unit-circuitry structure cascaded with the first GOA unit and configured to control outputting of a second set of three or more gate-driving signals respectively to a second set of three or more output terminals respectively connected to a second set of three or more gate lines associated with the display panel. Furthermore, the GOA circuit includes a capacitor connected from one in the second set of three output terminals of the second GOA unit to the pull-up node of the first GOA unit.

Optionally, the unit-circuitry structure includes a plurality of transistors configured to charge the pull-up node to a first voltage level. The plurality of transistors includes the three or more output transistors having respective three or more gate electrodes commonly coupled to the pull-up node and three or more drain electrodes being respectively provided with a first set of three or more clock signals substantially at a same time of the pull-up node being charged to the first voltage level. The first voltage level is sufficiently high to allow the first set of three or more clock signals to be passed respectively to three or more source electrodes of the three or more output transistors.

Optionally, the first set of three or more clock signals includes a first clock signal having a first pulse rising edge and a first pulse falling edge. The first set of three or more clock signals also includes a second clock signal having a second pulse rising edge rising simultaneously as the first pulse rising edge and a second pulse falling edge at a time after the first pulse falling edge by a first delay time. Additionally, the first set of three or more clock signals includes a third clock signal having a third pulse rising edge rising simultaneously as the first pulse rising edge and a third pulse falling edge at a time after the second pulse falling edge by a second delay time.

Optionally, the three or more source electrodes of the three or more output transistors are respectively connected to the first set of three or more output terminals to output the first set of three or more clock signals as the first set of three or more gate-driving signals.

Optionally, the first voltage level at the pull-up node is dropped to a second voltage level at a time of the first pulse falling edge when the first clock signal applied to a first one of the three or more output transistors is off. The second voltage level is further dropped to a third voltage level at a time of the second pulse falling edge when the second clock signal applied to a second one of the three or more output transistors is off. The third voltage level is again dropped to a fourth voltage level at a time of the third pulse falling edge when the third clock signal applied to a third one of the three or more output transistors is off.

Optionally, the pull-up node is applied with a compensation signal coupled from one of the second set of three or more gate-driving signals via the capacitor connected from one in the second set of three or more output terminals of the second GOA unit. The compensation signal includes a push-up pulse rising edge occurred at substantially same time as the first pulse falling edge to push up the second voltage level higher for maintaining the remaining ones of the three or more output transistors of the first GOA unit at an ON state during the first delay time and reducing a discharge time of the first one of the three or more output transistors from the ON state to an OFF state.

Optionally, the third voltage level is subsequently pushed higher due to the second voltage level being pushed higher for maintaining remaining ones of the three or more output transistors at the on state during the second delay time and reducing a discharge time for the second one of the three or more output transistors from the ON state to an OFF state. The fourth voltage level is subsequently pushed higher due to the second voltage level being pushed higher for reducing a discharge time for the third one of the three or more output transistors from the ON state to an OFF state.

Optionally, the second GOA unit is configured to receive a second set of three or more clock signals substantially at a same time of the push-up pulse rising edge. The second set of three or more clock signals respectively is applied to three or more drain electrodes of three or more output transistors of the second GOA unit to output as the second set of three or more gate-driving signals to the second set of three or more output terminals.

Optionally, the compensation signal is coupled from the one of the second set of three or more gate-driving signals originated from a first one of second set of three or more clock signals having a pulse rising edge being the push-up pulse rising edge.

Optionally, the second GOA unit is one subsequently next to the first GOA unit.

Optionally, the second GOA unit is one beyond a subsequently next one to the first GOA unit.

In another aspect, the present disclosure provides a method of driving a gate driver on array (GOA) circuit of a display panel. The GOA circuit includes a first GOA unit comprising a unit-circuitry structure having a pull-up node commonly coupled to three or more output transistors to control outputting of a first set of three or more gate-driving signals to a first set of three or more output terminals connected to a first set of three or more gate lines associated with the display panel. The GOA circuit further includes a second GOA unit comprising a substantially same unit-circuitry structure configured to control outputting of a second set of three or more gate-driving signals to a second set of three or more output terminals connected to a second set of three or more gate lines associated with the display panel. Additionally, the GOA circuit includes a capacitor connected between one of the second set of three or more output terminals of the second GOA unit and the pull-up node of the first GOA unit. The method includes transferring a compensation signal to the pull-up node of the first GOA unit via the capacitor from one in the second set of three or more output terminals of the second GOA unit.

Optionally, the method further includes respectively applying a first set of three or more clock signals simultaneously to three or more drain electrodes of the three or more output transistors, thereby bootstrapping the pull-up node to a first voltage level.

Optionally, the first set of three or more clock signals includes a first clock signal having a first pulse rising edge and a first pulse falling edge. The first set of three or more clock signals also includes a second clock signal having a second pulse rising edge rising simultaneously as the first pulse rising edge and a second pulse falling edge at a time after the first pulse falling edge by a first delay time. Additionally, the first set of three or more clock signals includes a third clock signal having a third pulse rising edge rising simultaneously as the first pulse rising edge and a third pulse falling edge at a time after the second pulse falling edge by a second delay time.

Optionally, the step of bootstrapping the pull-up node to a first voltage level includes pushing up the first voltage level sufficiently high to turn the three or more output transistors on to respectively pass the first set of three or more clock signals to three or more source electrodes of the three or more output transistors and output the first set of three or more clock signals to the first set of three or more output terminals as the first set of three or more gate-driving signals at a time of the first pulse rising edge.

Optionally, the first voltage level at the pull-up node is dropped to a second voltage level at a time of the first pulse falling edge when the first clock signal applied to a first one of the three or more output transistors is off. The second voltage level is further dropped to a third voltage level at a time of the second pulse falling edge when the second clock signal applied to a second one of the three or more output transistors is off. The third voltage level is again dropped to a fourth voltage level at a time of the third pulse falling edge when the third clock signal applied to a third one of the three or more output transistors is off.

Optionally, the method further includes respectively applying a second set of three or more clock signals to the second GOA unit at substantially same time as the first pulse falling edge and outputting the second set of three or more clock signals as the second set of three or more gate-driving signals to the second set of three or more output terminals.

Optionally, the step of transferring the compensation signal includes coupling one in the second set of three or more gate-driving signals as the compensation signal via the capacitor to the pull-up node of the first GOA unit. Additionally, the step of transferring the compensation signal includes pushing up the second voltage level higher by the compensation signal to maintain remaining ones of the three or more output transistors in the first GOA unit at an ON state during the first delay time and reduce a discharge time of a first one of the three or more output transistors from the ON state to an OFF state.

Optionally, the step of transferring the compensation signal further includes pushing up the third voltage level higher due to the second voltage level being pushed higher to maintain remaining ones of the three or more output transistors at the ON state during the second delay time and reduce a discharge time for the second one of the three or more output transistors from the ON state to an OFF state. The step of transferring the compensation signal again includes sequentially pushing up the fourth voltage level higher to reduce a discharge time for the third one of the three or more output transistors from the ON state to an OFF state.

In still another aspect, the present disclosure provides a display apparatus including a display panel and a GOA circuit described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
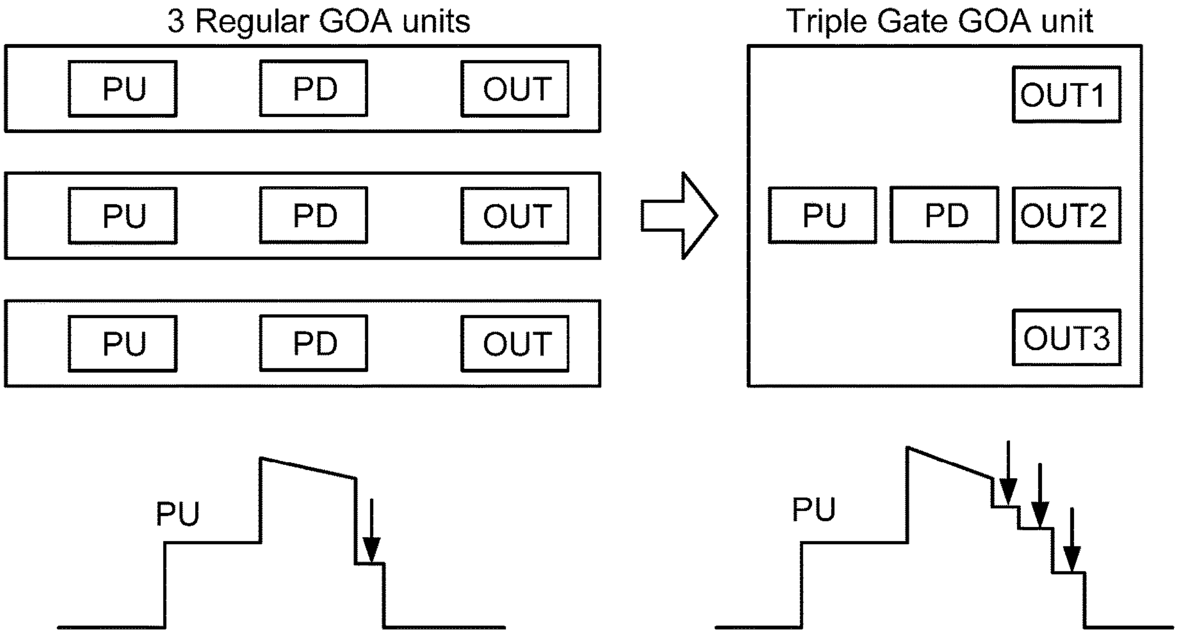
FIG. 1 is schematic diagram of an improvement of GOA circuit for driving a display panel according to some embodiments of the present disclosure.

Among many approaches to improve the GOA display technology, one option is to combine several regular GOA units into one GOA unit in the GOA circuit for a display panel. This is aimed to reduce usage of transistors for the whole GOA driving circuit to be installed in a narrower frame of the display panel. FIG. 1 shows an example that three regular GOA units are combined into one triple gate GOA unit. Each of the three regular GOA units includes a circuitry structure including a pull-up node PU and a pull-down node PD configured to control outputting a single gate-driving signal through an output terminal OUT to a gate line associated with the display panel. While, the triple gate GOA unit includes a circuitry structure including one common pull-up node PU and one pull-down node PD configured to control outputting three gate-driving signals respectively through three output terminals (OUT1, OUT2, OUT3) to respective three gate lines associated with the display panel. Optionally, each regular GOA unit contains 19 transistors while the triple gate GOA unit may contain 27 transistors. A GOA circuit based on the triple gate GOA unit can save 1/3(19×3−27)=10 transistors per gate line comparing to a conventional GOA circuit so that a much narrower frame can be implemented to install the GOA circuit with reduced number of transistors therein.

Referring to FIG. 1, a waveform of voltage level at the pull-up node PU for controlling the corresponding single gate-driving signal out of a single output terminal in a regular GOA unit is compared with a waveform of voltage level at the common pull-up node PU for controlling the corresponding three gate-driving signals out of respective three output terminals in a triple gate GOA unit. For the latter, the three gate-driving signals are outputted with relative delay times for applying these signals to corresponding gate lines in the display panel. But, the outputs of the three gate-driving signals are controlled by the voltage level at the common pull-up node PU, each time a (e.g., a first one) gate-driving signal is outputted, the voltage level at the PU node drops due to coupling effect induced by an effective capacitance involved in a corresponding output transistor in the GOA unit. Undesired drop in the voltage level of the pull-up node may cause variation in the gate line signal delay and eventually affect data input charging rate through all gate lines of the display panel.

Accordingly, the present disclosure provides, inter alia, a compensated GOA circuit, a method, and a display apparatus having the same, that substantially obviate one or more of the problems due to limitations and disadvantages of the related art. In one aspect, the present disclosure provides a compensated triple gate driver on army (GOA) circuit for driving a display panel.

Figure 2:
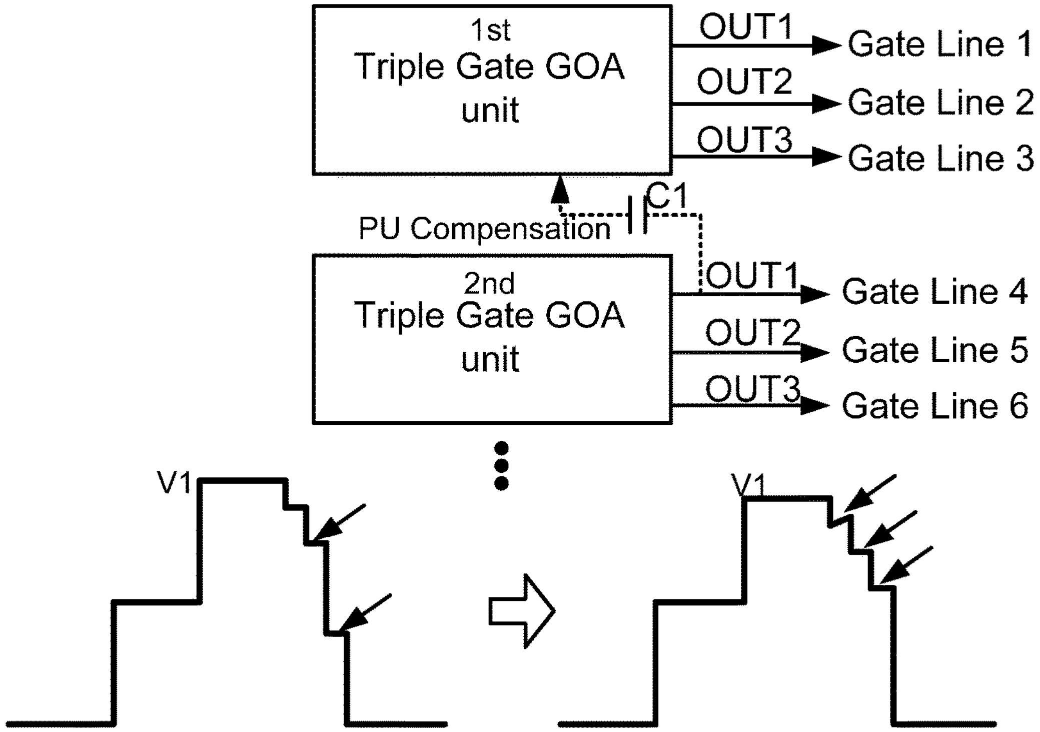
FIG. 2 is a simplified block diagram of a triple gate GOA circuit according to some embodiments of the present disclosure.

FIG. 2 is a simplified block diagram of a triple gate GOA circuit according to some embodiments of the present disclosure. Referring to FIG. 2, the triple gate GOA circuit is constructed by cascading a series of GOA units including at least a first GOA unit and a second GOA unit for providing multiple gate-driving signals respectively to multiple gate lines associated with a display panel. The first GOA unit is constructed based on a unit-circuitry structure having a pull-up node PU commonly coupled to three output transistors to control outputting of a first set of three gate-driving signals respectively to a first set of three output terminals, OUT1, OUT2, and OUT3, respectively connected to a first set of three gate lines associated with the display panel. The second GOA unit is constructed based on a substantially same unit-circuitry structure cascaded with the first GOA unit. The second GOA unit is configured to control outputting a second set of three gate-driving signals respectively to a second set of three output terminals respectively connected to a second set of three gate lines associated with the display panel. Optionally, the second GOA unit is a subsequent unit next to the first GOA unit in the series of GOA units. Optionally, the second GOA unit is a (n+2)-th unit in the series of GOA units if the first GOA unit is a n-th unit in the same series. Optionally, the first set of three gate lines corresponds to three consecutive rows of Gate Line 1, Gate Line 2, and Gate Line 3 and the second set of three gate lines corresponds to next three consecutive rows of Gate Line 4. Gate Line 5, and Gate Line 6. Additionally, the GOA circuit includes a capacitor C1 disposed between one in the second set of three output terminals of the second GOA unit and the pull-up node PU in the first GOA unit. Optionally, the capacitor C1 is disposed between a first output terminal OUT1 of the second set of three output terminals of the second GOA unit and the pull-up node PU. Optionally, the capacitor C1 is disposed between a second or third output terminal OUT2 or OUT3 of the second set of three output terminals of the second GOA unit and the pull-up node PU.

Optionally, the triple gate GOA unit may be replaced by a multi-gate GOA unit having the unit-circuitry structure including one common pull-up node PU and a pull-down node PD configured to control outputting three or more gate-driving signals respectively through three or more output terminals to respective three or more gate lines associated with the display panel. For example, the unit-circuitry structure of the multi-gate GOA unit may be configured to be associated with four output terminals linked to four gate lines. In another example, the unit-circuitry structure of the multi-gate GOA unit may be configured to be associated with five output terminals linked to five gate lines.

Figure 3:
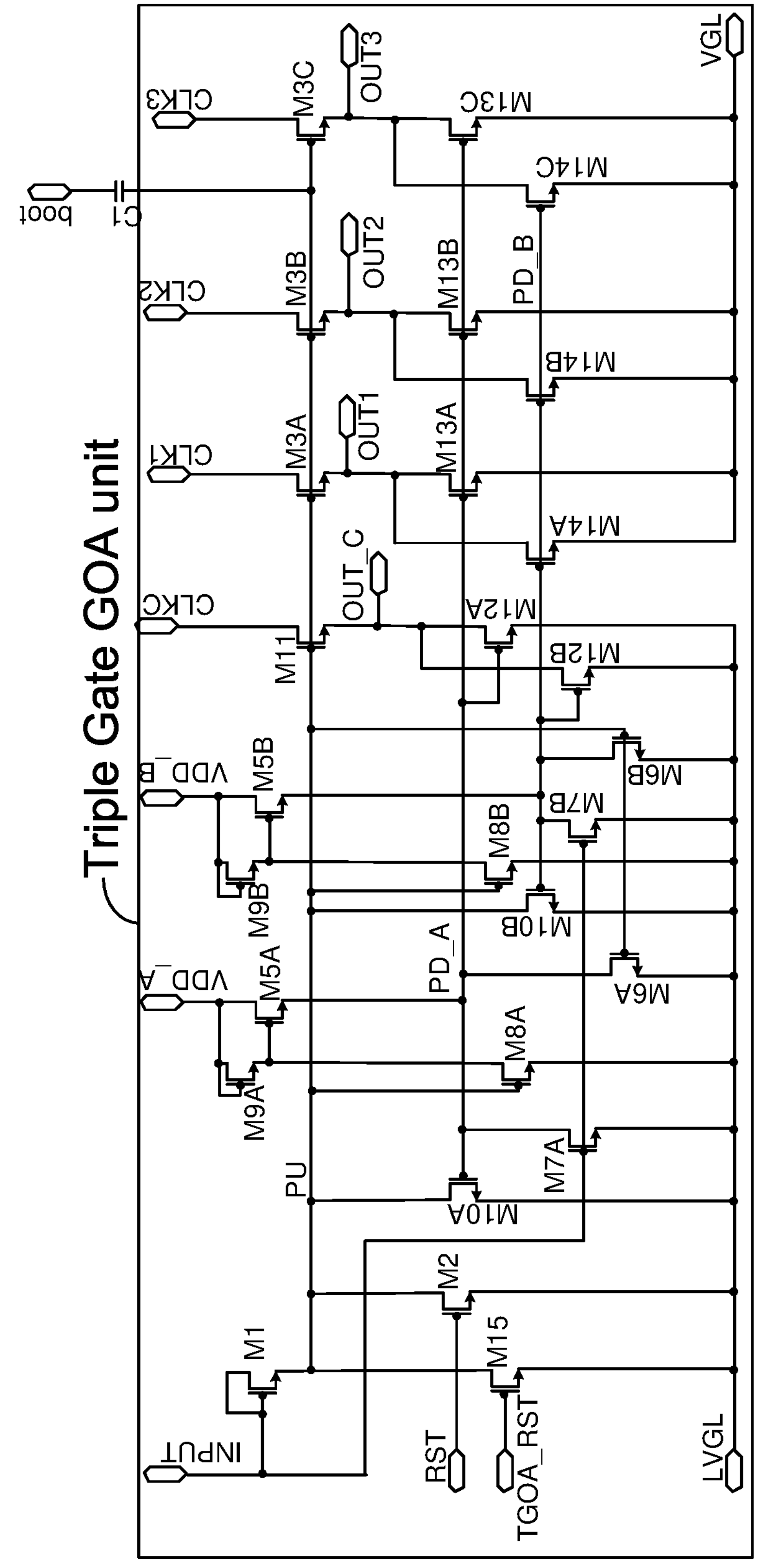
FIG. 3 is a circuit diagram of a GOA unit in the triple gate GOA circuit according to an embodiment of the present disclosure.

In some embodiments, the unit-circuitry structure of each GOA unit is substantially the same except that some circuit terminals may connect to different control/clock signal lines, different output terminals to different sets of three gate lines, different input/reset signal lines from external sources or from internal GOA units of different neighboring stages. In a specific embodiment, the unit-circuitry structure of any stage includes twenty seven transistors, e.g., as shown in FIG. 3, and is configured to charge the pull-up node PU to a first voltage level during operation of the GOA unit of the current stage. Referring to FIG. 2 and FIG. 3, the twenty seven transistors of the GOA unit include the three output transistors, M3A, M3B, and M3C, having respective three gate electrodes commonly coupled to the pull-up node PU and three drain electrodes being respectively provided with a first set of three clock signals CLK1, CLK2, CLK3 substantially at a same time of the pull-up node PU being charged to a first voltage level V1. Optionally, the pull-up node PU of the GOA unit has been charged to a high voltage level (or a turn-on voltage level of transistor) before the first set of three clock signals CLK1, CLK2, and CLK3 are provided. Optionally, the pull-up node PU is commonly connected to three gate electrodes of the three output transistors, M3A, M3B, and M3C, so that they are set to an ON state. As the first set of three clock signals CLK1, CLK2, and CLK3 are respectively introduced to the three drain electrodes thereof a bootstrapping effect induced by effective capacitance of each output transistor pushes the voltage level of the pull-up node PU higher to the first voltage level V1 (sufficiently higher than intrinsic threshold voltage of the output transistor). The three output transistors are all kept at the ON state to allow their source electrodes to be connected to their respective drain electrodes. In other words, the voltage level of the first set of three clock signals is passed respectively to the three source electrodes of the three output transistors (see FIG. 3). The higher the voltage level of the pull-up node PU, the larger of margin to allow it to drop to lower levels in three steps along with the first set of three clock signals being tinned off sequentially.

Optionally, the triple gate GOA unit may be replaced by a multi-gate GOA unit including the three or more output transistors having respective three or more gate electrodes commonly coupled to the pull-up node PU and three or more drain electrodes being respectively provided with a first set of three or more clock signals substantially at a same time of the pull-up node PU being charged to the first voltage level. As the first set of three or more clock signals are respectively introduced to the three or more drain electrodes thereof, a bootstrapping effect induced by effective capacitance of each output transistor pushes the voltage level of the pull-up node PU higher to the first voltage level. The three or more output transistors are all kept at the ON state to allow the respective three or more source electrodes to be connected to their respective drain electrodes. In other words, the voltage level of the first set of three or more clock signals is passed respectively to the three or more source electrodes of the three or more output transistors.

Referring to FIG. 3, unit-circuitry structure of the triple gate GOA unit also is configured to be connected without adding a capacitor between the pull-up node PU and each of the first set of three output terminals. This effectively reduces possible range of voltage drop in the pull-up node PU whenever a clock signal applied to the drain electrode of any output transistor is turned off. In other words, the voltage level at the pull-up node PU can be retained relatively higher each time a clock signal is off.

Referring to FIG. 3, the capacitor C1 is connected between the pull-up node PU and a boot terminal which is essentially connected to one output terminal of a next stage GOA unit. As shown in FIG. 2, the capacitor C1 is connected from the OUT1 of the second GOA unit to the pull-up node PU of the first GOA unit. This allows a voltage pulse to be applied to the pull-up node PU as a compensation voltage to boost the voltage level of PU especially during the voltage level drops from the first voltage level V1 to a second voltage level. As seen from the schematic showing of the waveform of the voltage level at the pull-up node PU, the second voltage level is pushed higher by the compensation voltage received by the pull-up node PU.

Referring to FIG. 3, additionally, the twenty seven transistors in the GOA unit include an alternative output transistor M11 coupled to an clock signal CLKC and also configured to be controlled by the pull-up node PU to output a special output signal OUT_C for providing shifted input signal for operating unit by unit in the GOA circuit. Accordingly, the twenty seven transistors in the GOA unit include an input transistor M1 being connected to an input terminal INPUT for providing an input signal, a first reset transistor M2 being connected to an first reset terminal RST for providing a first reset signal to the GOA unit, and a second reset transistor M15 being connected to an second reset terminal TGOA_RST for providing a second reset signal to all the GOA units, to handle corresponding input signal and reset signals for operating the GOA unit of current stage upon receiving output signals from one or more neighboring GOA units in the GOA series. The one or more neighboring GOA units may be a nearest neighbor GOA unit relative to the GOA unit of current stage or may be a second nearest neighbor GOA unit or beyond relative to the GOA unit of current stage depending on the register shift design setup of the GOA series.

Referring to FIG. 3 again, optionally, the twenty seven transistors in the GOA unit also include a first pair of transistors M5A and M9A for setting an initial voltage level of a first pull-down node PD_A based on a first power voltage supply VDD_A. Another pair of transistors M5B and M9B is used to set an initial voltage level of a second pull-down node PD_B based on a second power voltage supply VDD_B. Two transistors M8A and M8B are respectively used to pull down the voltage level of controlling the first pair of transistors M5A and M9A and the second pair of transistors M5B and M9B to be off. Another pair of transistors M6A and M6B is used to pull down the voltage level of the first pull-down node PD_A and the second pull-down node PD_B to a low voltage level given by a second voltage supply LVGL when PU is at a high voltage level. Another pair of transistors M7A and M7B is used to pull down the voltage level of the first pull-down node PD_A and the second pull-down node PD_B to the low voltage level given by the second voltage supply LVGL under the control of the input signal. Another pair of transistors MOA and MOB are used to pull down voltage level of PU to that given by LVGL when the PD_A and PD_B are respectively at a high voltage level. Other transistors M12A, M12B, M13A, M13B, M13C, M14A, M14B and M14C are used to control gate/source voltage of the output transistors, OUT_C, and OUT1, OUT2, and OUT3, respectively. M14A, M14B, and M14C are controlled by voltage level at PD_B to pull down the voltage levels of OUT1, OUT2, and OUT3 respectively to at least a voltage level of a third voltage supply VGL. The voltage level of the second voltage supply LVGL may be set lower than the third voltage supply VGL. Using separate OUT_C driven by a separate clock signal CLKC for inter-unit operation rather than using OUT1, OUT2, and OUT3 makes the operation of the GOA circuit more stable. In the current configuration (FIG. 3), the GOA unit has equal load applied on each of three output transistors M3A, M3B, and M3C as neither of CLK1, CLK2, and CLK3 is needed to be coupled to the alternative output transistor M11.

Figure 4:
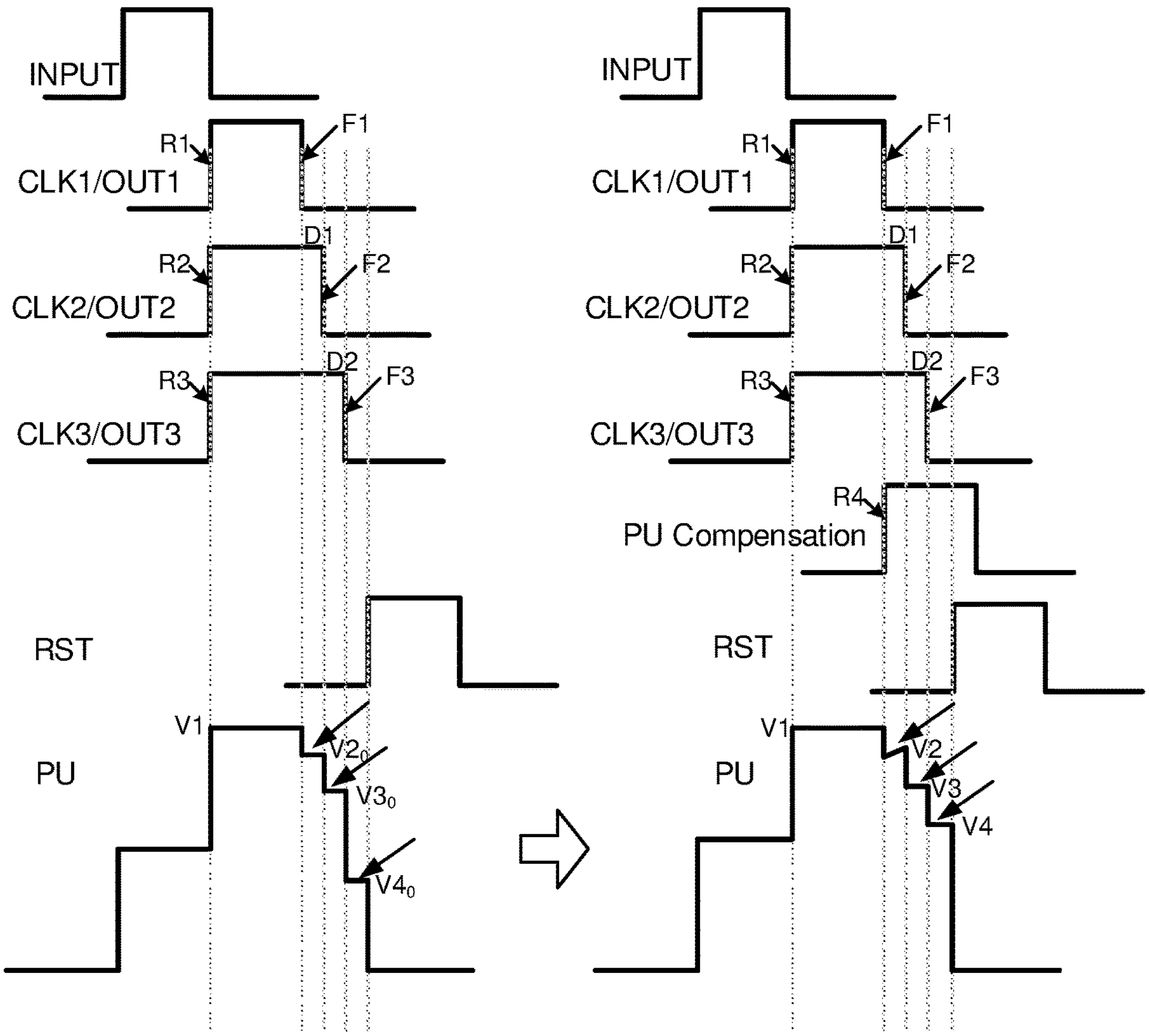
FIG. 4 is simplified timing diagram of driving a triple gate GOA circuit according to an embodiment of the present disclosure.

FIG. 4 is simplified timing diagram of driving a triple gate GOA circuit according to an embodiment of the present disclosure. Referring to FIG. 4, the timing diagram is corresponding only to a step of setting and compensating voltage levels of a pull-up node to drive the triple gate GOA unit under supplies of a first set of three clock signals. The left part of the timing diagram describes a first scenario that no compensation voltage is provided to the pull-up node. The right part of the timing diagram describes a second scenario that a compensation voltage is supplied to the pull-up node. Optionally, a timing diagram of driving a multi-gate GOA circuit with more than three output terminals sharing one pull-up node can be executed similarly to set the compensation voltage supplied to the pull-up node under control of more than three clock signals.

In an embodiment, the first set of three clock signals includes a first clock signal CLK1 having a first pulse rising edge R1 and a first pulse falling edge F1, a second clock signal CLK2 having a second pulse rising edge R2 rising simultaneously as the first pulse rising edge R1 and a second pulse falling edge F2 at a time after the first pulse falling edge F1 by a first delay time D1, and a third clock signal CLK3 having a third pulse rising edge R3 rising simultaneously as the first pulse rising edge R1 and a third pulse falling edge F3 at a time after the second pulse falling edge F2 by a second delay time D2.

As the first set of three clock signals are provided at the same time as the first pulse rising edge R1, the pull-up node PU is bootstrapped to a highest voltage level V1. In the first scenario without the compensation voltage, the first voltage level V1 at the pull-up node is dropped to a second voltage level $V2_0$ at a time of the first pulse falling edge F1 when the first clock signal CLK1 applied to a first one of the three output transistors (M3A) is off. The voltage level of the pull-up node PU is further dropped to a third voltage level $V3_0$ at a time of the second pulse falling edge F2 when the second clock signal CLK2 applied to a second one of the three output transistors (M3B) is off. The voltage level of the pull-up node PU is again dropped to a fourth voltage level $V4_0$ at a time of the third pulse falling edge F3 when the third clock signal CLK3 applied to a third one of the three output transistors (M3C) is off. Without compensation, the voltage drop at the pull-up node PU could be uncontrolled and undesirably large especially for the third drop to $V4_0$, which may cause the output signal out of the third output transistor M3C to have a slow falling edge. As it is further passed to the corresponding gate line for controlling data input to a pixel circuit in the display panel, it will cause data input of current row to be falsely loaded into next row since the gate is not fully closed.

In a second scenario with a compensation voltage being applied to the pull-up node PU, the voltage level of the pull-up node PU still will drop in respective three steps as described before. However, the compensation voltage is provided as a pulse having a push-up pulse rising edge R4 being substantially the same as the first pulse falling edge F1, thus it provides a boost to the voltage level at PU during the first delay time when the first clock signal CLK1 applied to M3A is off. The second voltage level $V2_0$ is pushed to a high value V2. Optionally, the second voltage level being pushed higher to V2 at the pull-up node PU is able to maintain the second output transistor M3B and the third output transistor M3C of the first GOA unit at an ON state during the first delay time D1. Additionally, the second voltage level being pushed higher to V2 at the pull-up node PU reduces a discharge time of the first output transistor M3A from the ON state to an OFF state. This allows the gate-driving signal out of the first output terminal OUT1 to the first gate line Gate Line 1 to have a fast falling edge, avoiding false loading data of current row into a next row.

Further, the third voltage level $V3_0$ is subsequently pushed higher to value V3 due to the second voltage level $V2_0$ being pushed higher to V2. This help to maintain the third output transistor M3C at the ON state during the second delay time D2 and reduce a discharge time for the second output transistor M3B from the ON state to an OFF state. The fourth voltage level $V4_0$ is subsequently pushed higher to V4 due to the second voltage level being pushed higher to V2 for reducing a discharge time for the third output transistor M3C from the ON state to an OFF state.

In an embodiment, the compensation voltage received at the pull-up node PU is coupled via the capacitor C1 (see FIG. 2 and FIG. 3) from second GOA unit being configured to receive a second set of three clock signals substantially at a same time of the push-up pulse rising edge R4. The second GOA unit is configured to be substantially the same as the first GOA unit such that the second set of three clock signals are respectively outputted as the second set of three gate-driving signals to the second set of three output terminals. Thus, one of the second set of three clock signals is just applied to one electrode of the capacitor C1 so that a pulse is coupled through to another electrode of the capacitor connected to the pull-up node PU as the compensation voltage. In a specific embodiment, the capacitor C1 is coupled between the first output terminal OUT1 of the second GOA unit and the pull-up node PU of the first GOA unit so that the compensation voltage is substantially the same as the first one of the second set of three clock signals. Optionally, the capacitor C1 is disposed between a second or third output terminal OUT2 or OUT3 of the second set of three output terminals of the second GOA unit and the pull-up node PU. At least, the setting of connecting the capacitor C1 to any output terminals of the second GOA unit is able to effectively generate the compensation voltage with a rising edge ahead of a rising edge of a reset signal RST.

Figure 5:
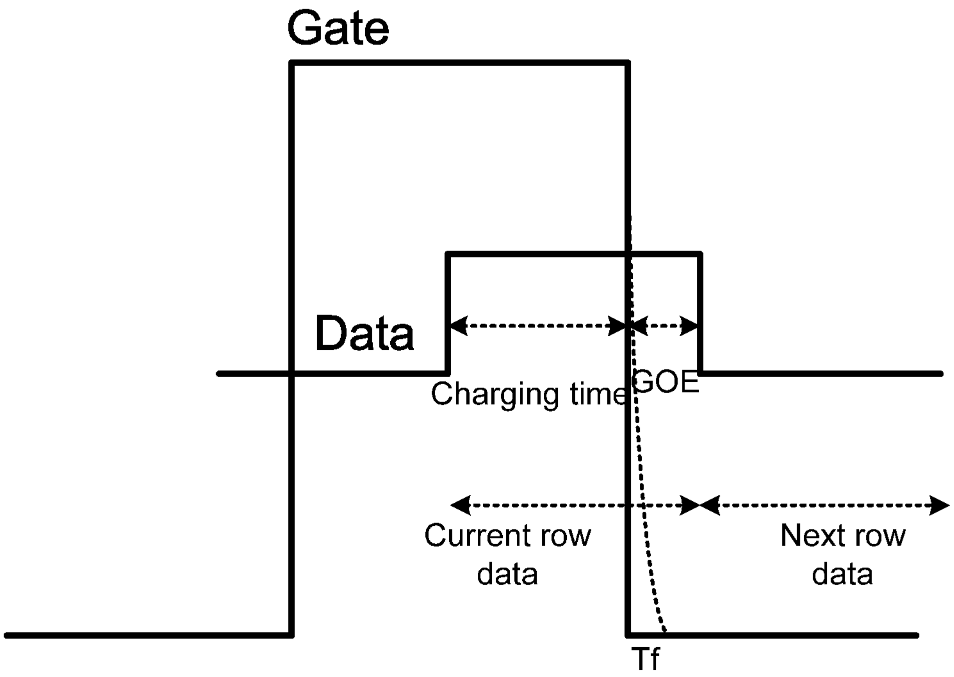
FIG. 5 is a schematic diagram of providing a gate-driving signal versus supplying data signal one row to next row according to the embodiment of the present disclosure.

FIG. 5 is a schematic diagram of providing a gate-driving signal versus supplying data signal one row to next row according to the embodiment of the present disclosure. Referred to FIG. 5, it is illustrating a pixel driving scheme where a gate-driving signal in a positive pulse is applied to a gate line for charging open an input path for a data signal to a pixel circuit in a display panel. The data signal has a delay GOE after the gate-driving signal. Ideally the GOE is set to within the falling edge duration Tf so that the gate line is fully closed before the data signal is finished its loading for the current row. In a bad scenario, the discharge rate of the gate-driving signal is slow, just like the third gate-driving signal outputted from the third output terminal of the first GOA unit is slowly falling off when the driving control voltage of the pull-up node PU becomes too low after driving the first two gate-driving signals. By connecting the capacitor from the second GOA unit to the pull-up node PU of the first GOA unit, the discharging time of each gate-driving signal, especially the third one of each set of three gate-driving signals, can be significantly reduced. One simulation result indicates that for a triple gate GOA circuit configured in FIG. 2, the falling edge duration Tf for the first gate-driving signal may be reduced from 1.05 μs to 1.01 μs, the falling edge duration Tf for the second gate-driving signal may be reduced from 1.28 μs to 1.17 μs, and the falling edge duration Tf for the third gate-driving signal may be reduced from 1.59 μs to 1.17 μs.

In another aspect, the present disclosure provides a method of driving a gate driver on array (GOA) circuit of a display panel. The GOA circuit may be configured as one shown in FIG. 2 and FIG. 3. In particular, the GOA circuit includes a series of GOA units cascaded to each other. The series of GOA units at least include first GOA unit including a unit-circuitry structure having a pull-up node commonly coupled to three or more output transistors to control outputting of a first set of three or more gate-driving signals to a first set of three or more output terminals connected to a first set of three or more gate lines associated with the display panel. The series of GOA units further include a second GOA unit including a substantially same unit-circuitry structure configured to control outputting of a second set of three or more gate-driving signals to a second set of three or more output terminals connected to a second set of three or more gate lines associated with the display panel. Additionally, the GOA circuit includes a capacitor connected between one of the second set of three or more output terminals of the second GOA unit and the pull-up node of the first GOA unit. Under this GOA circuit, the driving method includes transferring a compensation signal to the pull-up node of the first GOA unit via the capacitor from one in the second set of three or more output terminals of the second GOA unit.

In the embodiment, the method further includes respectively applying a first set of three or more clock signals simultaneously to three or more drain electrodes of the three or more output transistors; thereby bootstrapping the pull-up node to a first voltage level. The first voltage level is sufficiently high to turn the three or more output transistors on to respectively pass a first set of three or more clock signals having substantially a same pulse rising edge to three or more source electrodes of the three or more output transistors and output the first set of three or more clock signals to the first set of three or more output terminals as the first set of three or more gate-driving signals at a same time of the pulse rising edge.

In the embodiment, the method further includes respectively applying a second set of three or more clock signals to the second GOA unit at substantially same time as the first pulse falling edge of a first clock signal of the first set of three or more clock signals and outputting the second set of three or more clock signals as the second set of three or more gate-driving signals to the second set of three or more output terminals. Since the capacitor is connected to the one in the second set of three or more output terminals, the compensation voltage is just coupled from one of the second set of three or more clock signals having a pulse rising edge the same as the first pulse falling edge, thereby just providing a compensation to pull-up node PU to push its voltage level (falling from the first voltage level to a second voltage level when the first clock signal is off) higher.

The method furthermore includes pushing up subsequent a third voltage level (pulled down from the second voltage level when the second clock signal is off) higher due to the second voltage level being pushed higher to maintain remaining ones of the three or more output transistors at the ON state. This help to reduce a discharge time for the second one of the three or more output transistors from the ON state to an OFF state. Moreover, the method includes sequentially pushing up the fourth voltage level (pulled down from the third voltage level when the third clock signal is off) higher to reduce a discharge time for the third one of the three or more output transistors from the ON state to an OFF state.

In yet another aspect, the present disclosure provides a display apparatus including a display panel and a GOA circuit described herein. The display apparatus can be one of OLED display panel, a smart phone, a tablet computer, a television, a displayer, a notebook computer, a digital picture frame, a navigator, and any product or component having a display function. The GOA circuit includes more than two GOA units cascaded together in a multiple-stage series and a capacitor connected from one of output terminals of every next-stage GOA unit to a pull-up node of every current-stage GOA unit to couple a voltage pulse as a compensation to the voltage level at the pull-up node of the current-stage GOA unit, thereby enhancing the performance of using single pull-up node to control outputting three gate-driving signals to respective three gate lines associated with the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first” “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gate driver on array (GOA) circuit of a display panel comprising:

a first GOA unit having a unit-circuitry structure including a pull-up node commonly coupled to three or more output transistors to control outputting of a first set of three or more gate-driving signals respectively to a first set of three or more output terminals respectively connected to a first set of three or more gate lines associated with the display panel;

a second GOA unit comprising a substantially same unit-circuitry structure cascaded with the first GOA unit and configured to control outputting a second set of three or more gate-driving signals respectively to a second set of three or more output terminals respectively connected to a second set of three or more gate lines associated with the display panel; and a capacitor connected from one in the second set of three output terminals of the second GOA unit to the pull-up node of the first GOA unit.

2. The GOA circuit of claim 1, wherein the unit-circuitry structure comprises a plurality of transistors configured to charge the pull-up node to a first voltage level, the plurality of transistors includes the three or more output transistors having respective three or more gate electrodes commonly coupled to the pull-up node and three or more drain electrodes being respectively provided with a first set of three or more clock signals substantially at a same time of the pull-up node being charged to the first voltage level, the first voltage level being sufficiently high to allow the first set of three or more clock signals to be passed respectively to three or more source electrodes of the three or more output transistors.

3. The GOA circuit of claim 2, wherein the first set of three or more clock signals includes a first clock signal having a first pulse rising edge and a first pulse falling edge, a second clock signal having a second pulse rising edge rising simultaneously as the first pulse rising edge and a second pulse falling edge at a time after the first pulse falling edge by a first delay time, and a third clock signal having a third pulse rising edge rising simultaneously as the first pulse rising edge and a third pulse falling edge at a time after the second pulse falling edge by a second delay time.

4. The GOA circuit of claim 3, wherein the three or more source electrodes of the three or more output transistors are respectively connected to the first set of three or more output terminals to output the first set of three or more clock signals as the first set of three or more gate-driving signals.

5. The GOA circuit of claim 3, wherein the first voltage level at the pull-up node is dropped to a second voltage level at a time of the first pulse falling edge when the first clock signal applied to a first one of the three or more output transistors is off and is further dropped to a third voltage level at a time of the second pulse falling edge when the second clock signal applied to a second one of the three or more output transistors is off and is again dropped to a fourth voltage level at a time of the third pulse falling edge when the third clock signal applied to a third one of the three or more output transistors is off.

6. The GOA circuit of claim 5, wherein the pull-up node is applied with a compensation signal coupled from one of the second set of three or more gate-driving signals via the capacitor connected from one in the second set of three or more output terminals of the second GOA unit, the compensation signal comprising a push-up pulse rising edge occurred at substantially same time as the first pulse falling edge to push up the second voltage level higher for maintaining the remaining ones of the three or more output transistors of the first GOA unit at an ON state during the first delay time and reducing a discharge time of the first one of the three or more output transistors from the ON state to an OFF state.

7. The GOA circuit of claim 6, wherein the third voltage level is subsequently pushed higher due to the second voltage level being pushed higher for maintaining remaining ones of the three or more output transistors at the on state during the second delay time and reducing a discharge time for the second one of the three or more output transistors from the ON state to an OFF state; the fourth voltage level is subsequently pushed higher due to the second voltage level being pushed higher for reducing a discharge time for the third one of the three or more output transistors from the ON state to an OFF state.

8. The GOA circuit of claim 6, wherein the second GOA unit is configured to receive a second set of three or more clock signals substantially at a same time of the push-up pulse rising edge, the second set of three or more clock signals respectively being applied to three or more drain electrodes of three or more output transistors of the second GOA unit to output as the second set of three or more gate-driving signals to the second set of three or more output terminals.

9. The GOA circuit of claim 8, wherein the compensation signal is coupled from the one of the second set of three or more gate-driving signals originated from a first one of second set of three or more clock signals having a pulse rising edge being the push-up pulse rising edge.

10. The GOA circuit of claim 1, wherein the second GOA unit is one subsequently next to the first GOA unit.

11. The GOA circuit of claim 1, wherein the second GOA unit is one beyond a subsequently next one to the first GOA unit.

12. A display apparatus comprising a display panel and a GOA circuit of any one of claims 1 to 11.

13. A method of driving a gate driver on array (GOA) circuit of a display panel, wherein the GOA circuit comprises:

a first GOA unit comprising a unit-circuitry structure having a pull-up node commonly coupled to three or more output transistors to control outputting of a first set of three or more gate-driving signals to a first set of three or more output terminals connected to a first set of three or more gate lines associated with the display panel;

a second GOA unit comprising a substantially same unit-circuitry structure configured to control outputting of a second set of three or more gate-driving signals to a second set of three or more output terminals connected to a second set of three or more gate lines associated with the display panel; and a capacitor connected between one of the second set of three or more output terminals of the second GOA unit and the pull-up node of the first GOA unit;

the method comprising:

transferring a compensation signal to the pull-up node of the first GOA unit via the capacitor from one in the second set of three or more output terminals of the second GOA unit.

14. The method of claim 13, further comprising: respectively applying a first set of three or more clock signals simultaneously to three or more drain electrodes of the three or more output transistors, thereby bootstrapping the pull-up node to a first voltage level.

15. The method of claim 14, wherein the first set of three or more clock signals include a first clock signal having a first pulse rising edge and a first pulse falling edge, a second clock signal having a second pulse rising edge rising simultaneously as the first pulse rising edge and a second pulse falling edge at a time after the first pulse falling edge by a first delay time, and a third clock signal having a third pulse rising edge rising simultaneously as the first pulse rising edge and a third pulse falling edge at a time after the second pulse falling edge by a second delay time.

16. The method of claim 15, wherein bootstrapping the pull-up node to a first voltage level comprises pushing up the first voltage level sufficiently high to turn the three or more output transistors on to respectively pass the first set of three or more clock signals to three or more source electrodes of the three or more output transistors and output the first set of three or more clock signals to the first set of three or more output terminals as the first set of three or more gate-driving signals at a time of the first pulse rising edge.

17. The method of claim 16, wherein the first voltage level at the pull-up node is dropped to a second voltage level at a time of the first pulse falling edge when the first clock signal applied to a first one of the three or more output transistors is off and is further dropped to a third voltage level at a time of the second pulse falling edge when the second clock signal applied to a second one of the three or more output transistors is off and is again dropped to a fourth voltage level at a time of the third pulse falling edge when the third clock signal applied to a third one of the three or more output transistors is off.

18. The method of claim 17, further comprising respectively applying a second set of three or more clock signals to the second GOA unit at substantially same time as the first pulse falling edge and outputting the second set of three or more clock signals as the second set of three or more gate-driving signals to the second set of three or more output terminals.

19. The method of claim 18, wherein transferring the compensation signal comprises coupling one in the second set of three or more gate-driving signals as the compensation signal via the capacitor to the pull-up node of the first GOA unit; pushing up the second voltage level higher by the compensation signal to maintain remaining ones of the three or more output transistors in the first GOA unit at an ON state during the first delay time and reduce a discharge time of the first one of the three or more output transistors from the ON state to an OFF state.

20. The method of claim 19, further comprising pushing up the third voltage level higher due to the second voltage level being pushed higher to maintain remaining ones of the three or more output transistors at the ON state during the second delay time and reduce a discharge time for the second one of the three or more output transistors from the ON state to an OFF state; and sequentially pushing up the fourth voltage level higher to reduce a discharge time for the third one of the three or more output transistors from the ON state to an OFF state.

* * * * *